(12) United States Patent
Navon et al.

(10) Patent No.: US 9,947,401 B1
(45) Date of Patent: Apr. 17, 2018

(54) PEAK CURRENT MANAGEMENT IN NON-VOLATILE STORAGE

(71) Applicant: SanDisk Technologies LLC, Plano, TX (US)

(72) Inventors: Ariel Navon, Revava (IL); Tz-Yi Liu, Palo Alto, CA (US); Eran Sharon, Rishon Lezion (IL); Alexander Bazarsky, Holon (IL); Judah Hahn, Ofra (IL); Alon Eyal, Zichron Yaacov (IL); Omer Fainzilber, Even Yehuda (IL)

(73) Assignee: SanDisk Technologies LLC, Plano, TX (US)

( * ) Notice: Subject to any disclaimer, the term of this patent is extended or adjusted under 35 U.S.C. 154(b) by 6 days.

(21) Appl. No.: 15/388,154

(22) Filed: Dec. 22, 2016

(51) Int. Cl.
| | |
|---|---|
| *G11C 19/08* | (2006.01) |
| *G11C 13/00* | (2006.01) |
| *G06F 11/07* | (2006.01) |
| *G06F 11/30* | (2006.01) |
| *G06F 11/10* | (2006.01) |
| *G11C 29/52* | (2006.01) |

(52) U.S. Cl.
CPC ........ *G11C 13/0069* (2013.01); *G06F 11/076* (2013.01); *G06F 11/0727* (2013.01); *G06F 11/0793* (2013.01); *G06F 11/3034* (2013.01); *G06F 11/3062* (2013.01); *G06F 11/1068* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 7,127,573 B1 | 10/2006 | Strongin et al. | |
| 7,924,648 B2 | 4/2011 | Sokolov et al. | |
| 8,745,369 B2 | 6/2014 | Yurzola et al. | |
| 8,861,258 B2 | 10/2014 | Lan et al. | |
| 8,929,170 B2 | 1/2015 | Park et al. | |
| 9,070,481 B1* | 6/2015 | Ellis ...................... | G11C 29/50 |
| 9,312,002 B2 | 4/2016 | Navon et al. | |
| 9,368,214 B2 | 6/2016 | Kasorla et al. | |
| 2014/0153625 A1* | 6/2014 | Vojcic ..................... | H04L 1/005 375/224 |
| 2015/0149856 A1 | 5/2015 | Wu et al. | |
| 2016/0077961 A1 | 3/2016 | Erez et al. | |
| 2016/0188231 A1* | 6/2016 | Mittelholzer ......... | G06F 3/0619 714/704 |
| 2016/0293264 A1 | 10/2016 | Al-Shamma et al. | |

* cited by examiner

*Primary Examiner* — Son Dinh
*Assistant Examiner* — Sultana Begum
(74) *Attorney, Agent, or Firm* — Vierra Magen Marcus LLP

(57) ABSTRACT

Technology is described for keeping current (e.g., peak power supply current or ICC) in a non-volatile memory system within a target while maintaining high throughput. Programming conditions are adaptively changed at the sub-codeword level in order to keep power supply current of the memory system within a target. In one embodiment, a chunk of data that corresponds to a sub-codeword is written while consuming lower than normal programming current in order to keep power supply current within a target. The relatively low programming current may increase the expected raw BER. However, other portions of the codeword can be written with a higher than normal programming current, which results in a lower expected bit raw error rate for the memory cells that store that portion.

19 Claims, 13 Drawing Sheets

PEAK CURRENT MANAGEMENT IN NON-VOLATILE STORAGE

BACKGROUND

Semiconductor memory is widely used in various electronic devices such as mobile phones, digital cameras, personal digital assistants, SSDs, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery).

There is a finite possibility that a bit of data that was programmed is read back incorrectly. Such errors can occur for a variety of reasons. Such errors are referred to as a raw, or uncorrected, bit error rate (BER). Typically, when data is stored in non-volatile memory, a unit of data is encoded by adding some redundant bits to the unit of data. The combination of the unit of data and the redundant bits is referred to as a codeword. When the codeword is later read, a decoder is used to decode the codeword. The decoder is able to correct at least some of the errors. However, if the raw BER is too high, then the decoder might not be able to correct all of the errors.

DETAILED DESCRIPTION

Figure 1A:
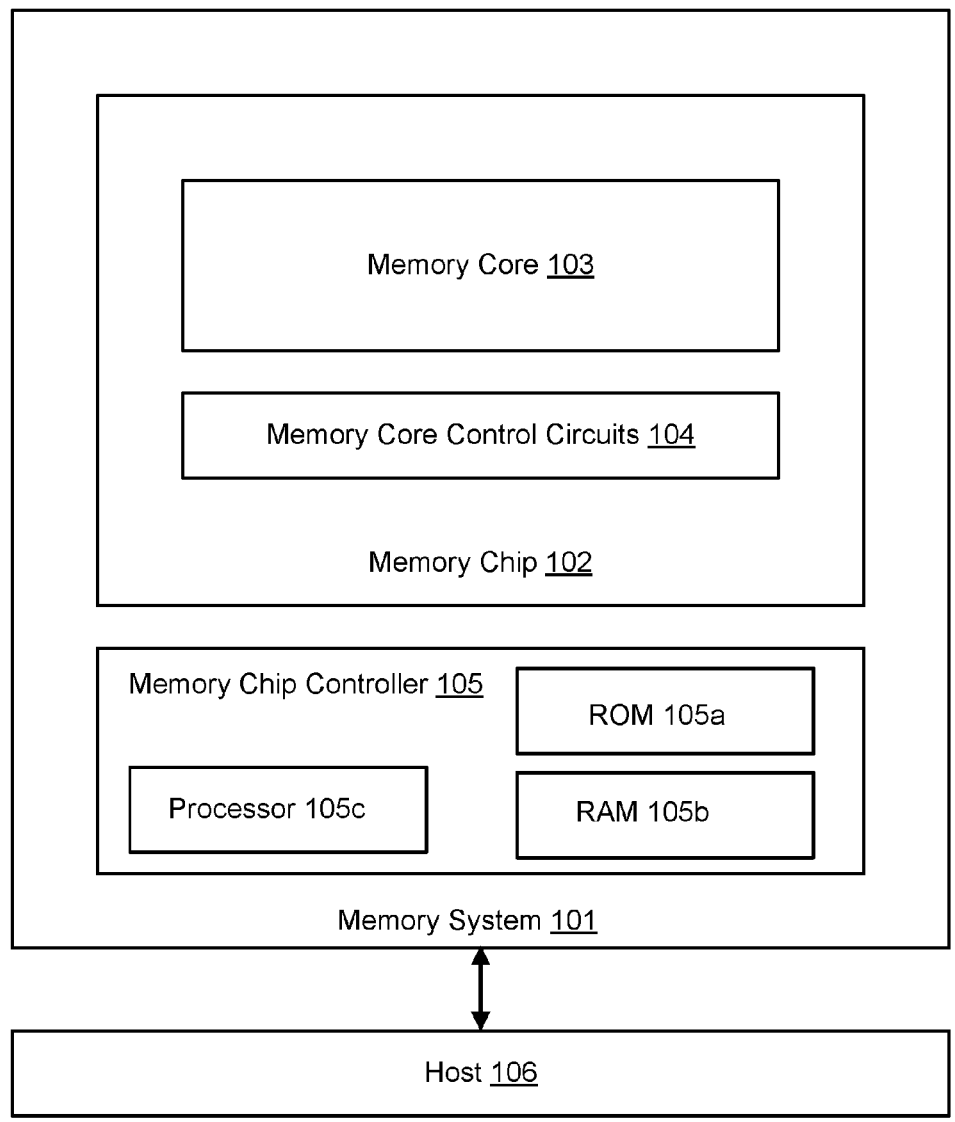
FIG. 1A depicts one embodiment of a memory system and a host.

Technology is described for keeping current (e.g., power supply current or ICC) in a non-volatile memory system within an allowed peak current while maintaining high throughput. The non-volatile memory system may include memory dies (or dice) and a system controller for controlling operations performed by each memory die (e.g., read operations, write operations, or erase operations).

Typically, the system controller attempts to maintain a high-throughput while staying within an allowed peak power supply current. If the power supply current goes too high, then one possible option is for the system controller to temporarily suspend a memory array operation to one or more memory die to stay within the allowed peak power supply current. However, this comes at the expense of reducing throughout.

When programming some non-volatile memory there may be a relationship between the programming current and the reliability of the data programmed therein. For example, for some reversible resistivity memory (ReRAM), programming with a lower current level may result in a higher raw (or uncorrected) bit error rate. Conversely, programming with a higher current level may result in a lower raw bit error rate.

Moreover, some non-volatile memory may be written to with fine granularity, which allows the memory to be written in sub-codeword chunks. For example, some reversible resistivity memory can be written in units as small as one bit. Hence, a portion of a codeword, such as some integer number of bytes of the codeword can be separately programmed. Herein, these smaller chunks of a codeword are referred to as a "sub-codeword". Note that a codeword is the smallest unit of data that can be decoded (even though a sub-codeword may be programmed or read by itself).

In one embodiment, programming conditions are adaptively changed at the sub-codeword level in order to keep power supply current of the memory system within a target current level. In one embodiment, a chunk of data that corresponds to a sub-codeword is written while consuming lower than normal programming current in order to keep power supply current within a target current level. The relatively low programming current may increase the expected raw BER. However, other portions of the codeword can be written with a higher than normal programming current, which may result in a lower expected bit raw error rate for the memory cells that store that portion. In some embodiments, the total raw BER for the codeword is not increased by this technique. When reading back (and decoding) the entire codeword, it is the total raw BER of the entire codeword that matters for some decoders. For example, low density parity check (LDPC) decoders, due to their statistical nature, may be primarily affected by the average BER of the entire codeword. Hence, the codeword can be successfully decoded even if the BER is not spread evenly across the sub-codewords.

Moreover, the memory system does not need to hold off from programming a sub-codeword chunk in order to keep the system-wide current within a target. Hence, throughout remains high.

Note that herein the term "bit error rate" refers to the raw (or uncorrected) bit error rate, unless specifically denoted as the "corrected bit error rate," which results after decoding the codeword.

FIG. 1A depicts one embodiment of a memory system 101 and a host 106.

The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip (or die) 102. The memory chip 102 may include volatile memory and/or non-volatile memory.

The controller 105 may comprise a processor 105c and storage devices (memory) such as ROM 105a and RAM 105b. The storage devices comprises code such as a set of instructions, and the processor 105c is operable to execute the set of instructions to send read, write, erase, and other commands to the memory chip 102. Alternatively or additionally, processor 105c can access code from the memory core 103, such as a reserved area of memory cells. The controller 105 stores a programming current to BER table in some embodiments. One embodiment of this table describes a relationship between the programming current and an expected BER. The programming current to BER table could be stored in RAM 105b, ROM 105a, or elsewhere on the memory system 100, such as in the memory core 103.

Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, setting, resetting, erasing, programming, or reading operations. Herein, "setting" and "resetting" are two examples of programming operations. A programming operation may also be referred to as a write operation.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

In one embodiment, the memory chip controller 105 forms codewords from the data to be written and the ECC data. For example, the memory chip controller 105 determines ECC data for a unit of data, and appends the ECC data to the unit of data to form the codeword. The memory chip controller 105 may instruct the memory chip 102 to program a sub-codeword portion of a selected codeword in certain non-volatile memory cells. The memory chip controller 105 may also send the memory chip 102 an indication of the amount of current to use when programming that sub-codeword. For example, memory chip controller 105 may send a digital value that indicates a programming current, or some other programming condition.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including forming, setting, resetting, erasing, programming, or reading operations. In one example, one or more managing circuits may comprise an on-chip memory controller for determining row and column address, word line and bit line addresses, memory array enable signals, and data latching signals.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 1B:
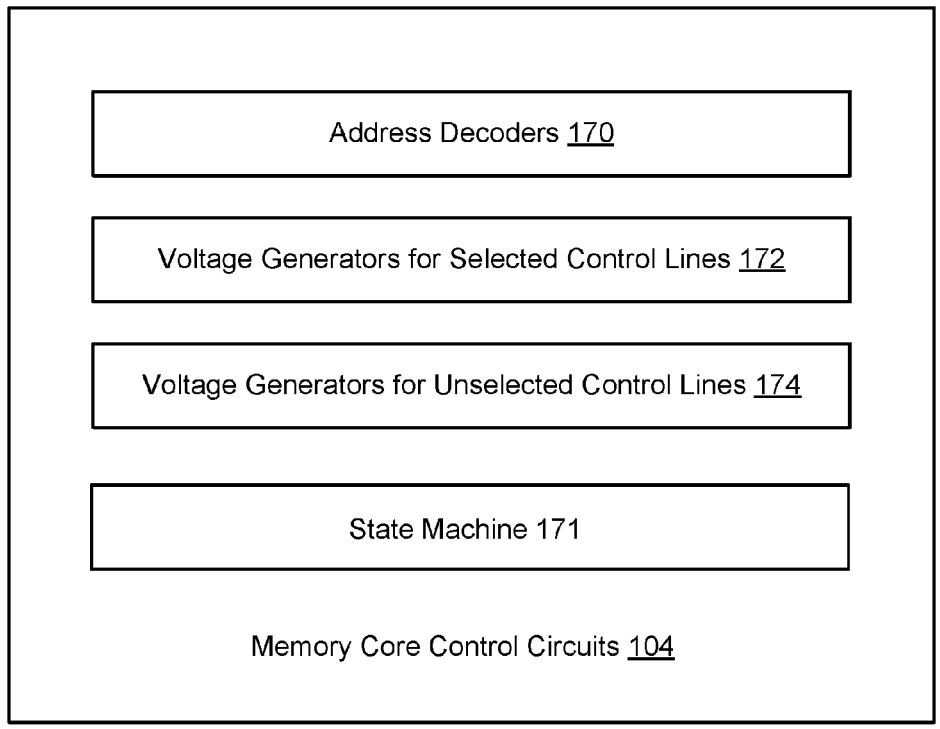
FIG. 1B depicts one embodiment of memory core control circuits in FIG. 1A.

FIG. 1B depicts one embodiment of memory core control circuits 104 in FIG. 1A. As depicted, the memory core control circuits 104 include address decoders 170, state machine 171, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block or memory array. The state machine 171 may provide chip-level control of memory operations. In one example, state machine 171 may cause various voltages to be applied to control lines (e.g., selected word lines and unselected word lines) within a memory array corresponding with a particular memory operation (e.g., a read or write operation). The state machine 171 may implement control logic for controlling read, write, or erase operations. In some cases, the state machine 171 may include random logic that has been synthesized using standard cells.

FIGS. 1C-1F depict embodiments of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
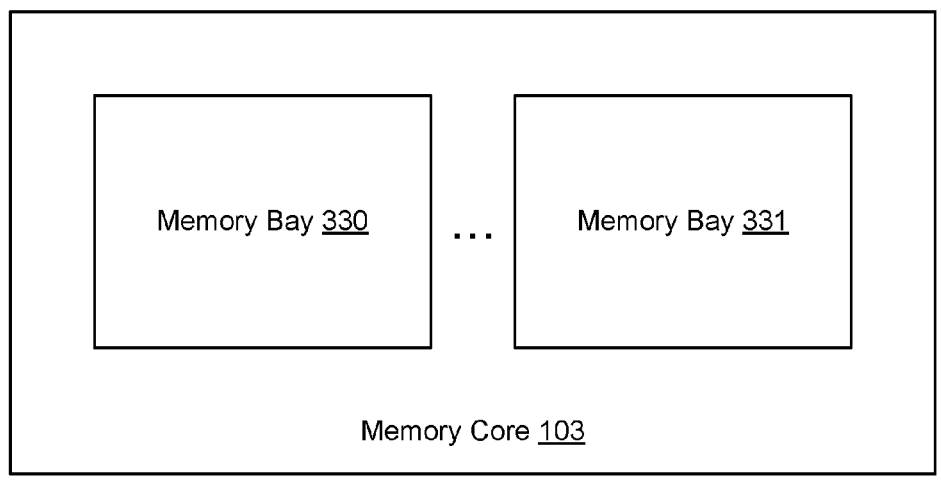
FIGS. 1C, 1D, 1E and 1F depict embodiments of a memory core organization that includes a memory core having multiple memory bays, and each memory bay having multiple memory blocks.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
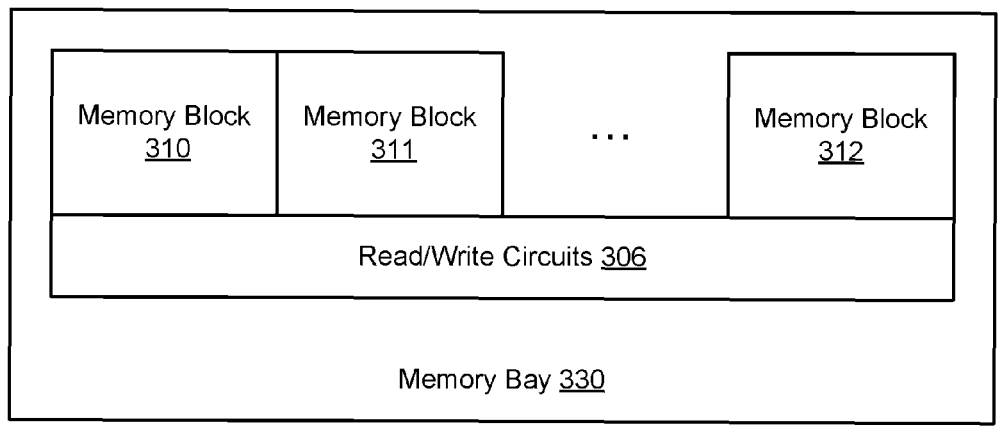

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
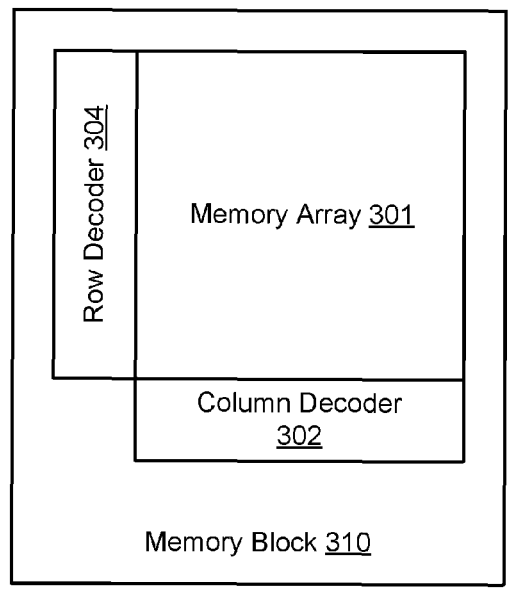

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
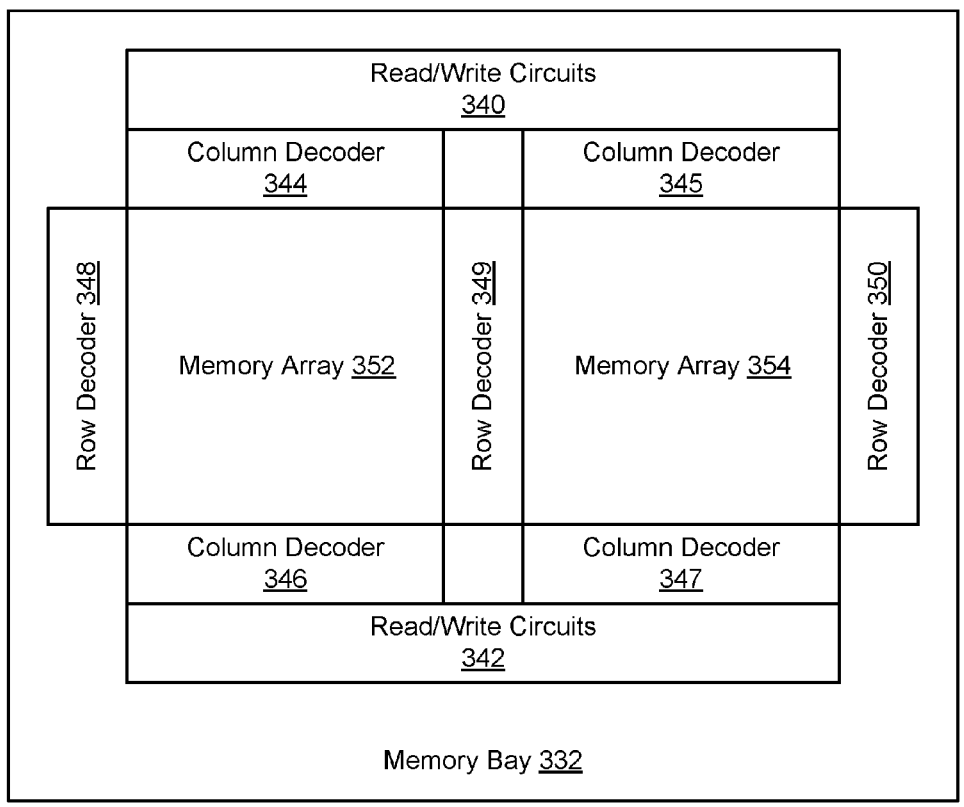

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2:
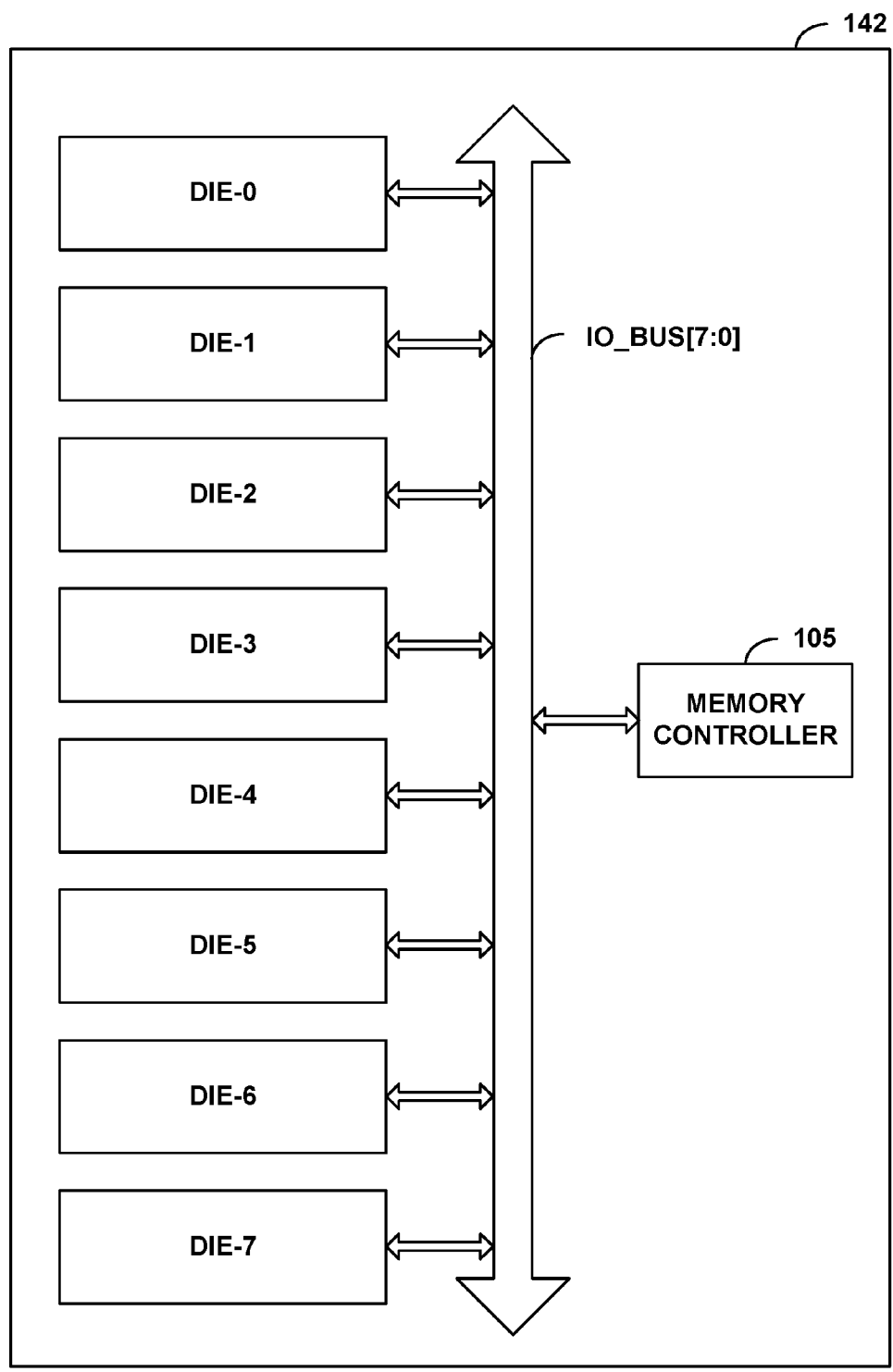
FIG. 2 depicts an embodiment of a portion of a memory system.

Some embodiments of a non-volatile storage system will include multiple memory die 108 in communication with one or more memory controllers. Each of the memory die 108 may have multiple bays. FIG. 2 depicts an embodiment of a portion of a system, such as memory system 101 in FIG. 1A, included within a package 142. The portion of the system includes memory die DIE-0, DIE-1, . . . , DIE-7 and a memory controller 105 connected to memory die DIE-0, DIE-1, . . . , DIE-7 via a shared 8-bit I/O bus IO_BUS[7:0]. Although eight memory die are depicted in FIG. 2, memory controller 105 may be connected to or in communication with more than or fewer than eight memory die via a shared I/O bus.

In some cases, memory die DIE-0, DIE-1, . . . , DIE-7 may be vertically stacked within package 122 or arranged in a horizontal manner within package 142. In some cases, package 124 may include a BGA package, a TSOP package, or other type of package. As depicted, memory controller 105 may include a memory controller, such as memory controller 105 in FIG. 1A, and may broadcast various status commands and receive data via the shared IO_BUS[7:0]. Memory die DIE-0, DIE-1, . . . , DIE-7 may include NAND Flash memory die, ReRAM memory die, or other type of memory die.

In one embodiment, the memory controller 105 polls the memory die as to their current usage (e.g., power supply current (ICC) usage). Each memory die may have circuitry thereon, which measures its present current usage. In another embodiment, each memory die may estimate its present and/or future current usage based on memory array operations that are executing and/or are scheduled to execute. For example, the memory die may store a table that indicates that a programming operation is expected to consume a certain amount of current. In some embodiments, these current usages refer to a peak current usage. For example, the memory die may store a table that indicates the expected peak current usage of various memory array operations.

In another embodiment, circuitry external to the memory dies measures the current used by the memory die. This circuitry may monitor one or more pins of the memory die. This current usage information is reported to the memory controller 105, in one embodiment.

Figure 3:
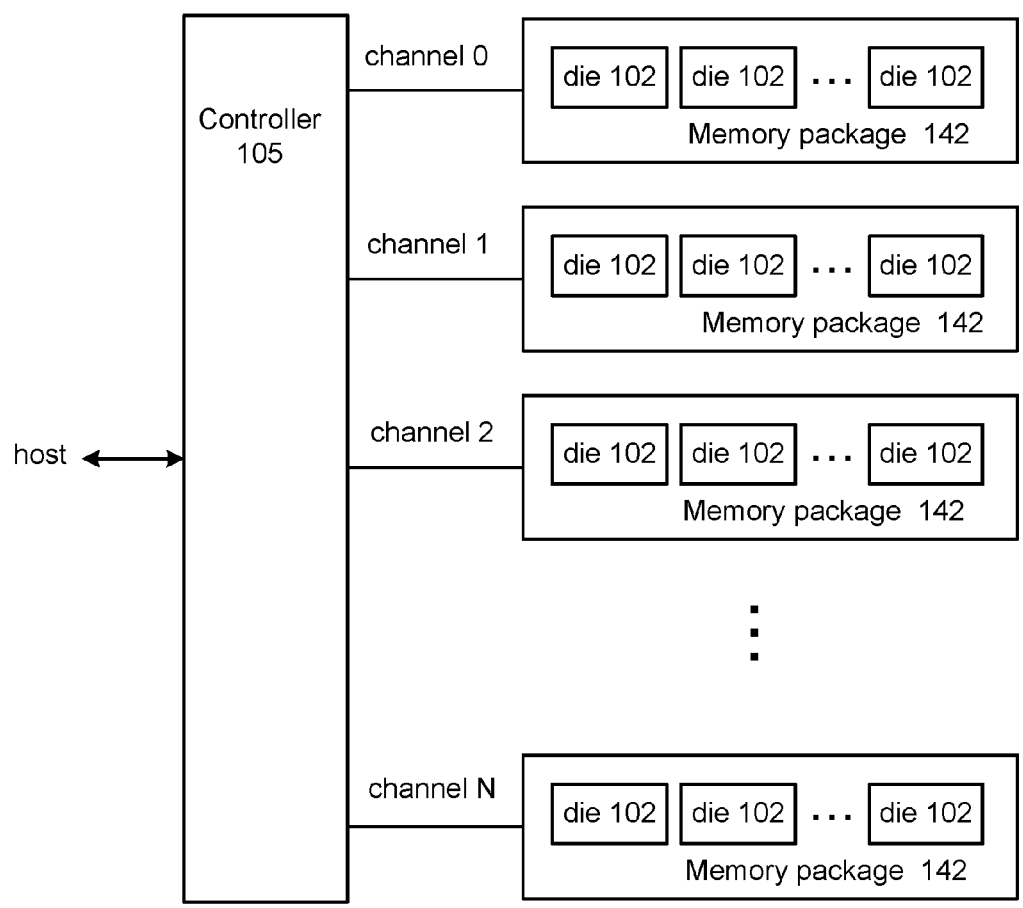
FIG. 3 depicts an embodiment of the multiple memory die grouped into a set of packages.

In one example, depicted in FIG. 3, the multiple memory die 102 can be grouped into a set of one or more packages. Each memory package 142 includes one or more memory die 102 in communication with Controller 105. FIG. 3 show N memory packages 142, and N channels for communication between Controller 105 and the memory die 108 of respective packages. Controller 105 communicates with the host. In other embodiments, Controller 105 can communicate with any entity via a wired or wireless network (or other type of) connection.

Each memory package 142 may have a set of pins (or alternatively pads) that are configured for input and/or output. The pins (or pads) form part of the interface between the controller 105 and the memory package 142. Some of the pins (or pads) may be designated as I/O pins. This may allow for commands, addresses, and data to be received from the memory controller 105, as well as for data and other information to be returned to the memory controller 105.

The controller 105 may poll the various memory die 102 in FIG. 3 for their current usage, similar to the embodiment of FIG. 2. Alternatively, the various memory die 102 could report their current usage to the controller 105 without being polled.

Figure 4:
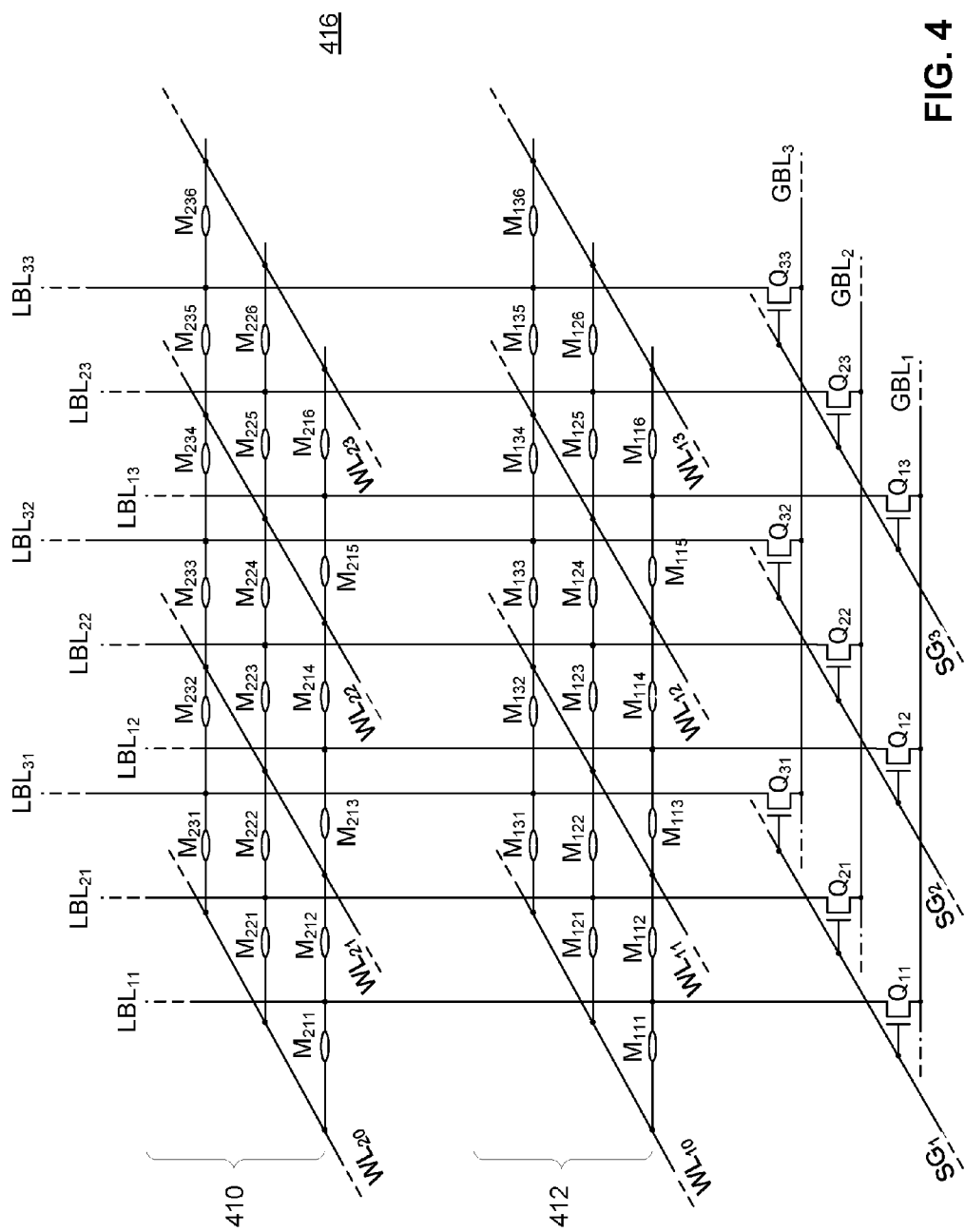
FIG. 4 depicts one embodiment of a portion of a monolithic three-dimensional memory array.

FIG. 4 depicts one embodiment of a portion of a monolithic three-dimensional memory array 416 that includes a first memory level 412 positioned below a second memory level 410. Memory array 416 is one example of an implementation for memory array 301 in FIG. 1E, or memory array 352, 34 of FIG. 1F. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one embodiment, the local bit lines are formed from the crystalline silicon hollow pillar 10.

In one example, the particular memory cell may include a reversible resistance-switching material, such as a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

In one embodiment, the line select devices $Q_{11}$-$Q_{31}$ are used to limit the programming current that is allowed to a selected local bit lines $LBL_{11}$-$LBL_{31}$. However, an additional transistor could be placed in series with the line select devices $Q_{11}$-$Q_{31}$ to instead limit the programming current that is allowed to a selected local bit lines $LBL_{11}$-$LBL_{31}$.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

In one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as "setting" the reversible resistance-switching element. The process of switching the resistance from the low-resistivity state to the high-resistivity state may be referred to as "resetting" the reversible resistance-switching element. The high-resistivity state may be associated with binary data "1" and the low-resistivity state may be associated with binary data "0." In other embodiments, setting and resetting operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is "set" into the low-resistivity state as the reversible resistance-switching element may have been placed into a resistance state that is higher than the high-resistivity state when fabricated. The term "forming" may refer to the setting of a reversible resistance-switching element into a low-resistivity state for the first time after fabrication or the resetting of a reversible resistance-switching element into a high-resistivity state for the first time after fabrication. In some cases, after a forming operation or a memory cell preconditioning operation has been performed, the reversible resistance-switching element may be "reset" to the high-resistivity state and then set again to the low-resistivity state.

Figure 5:
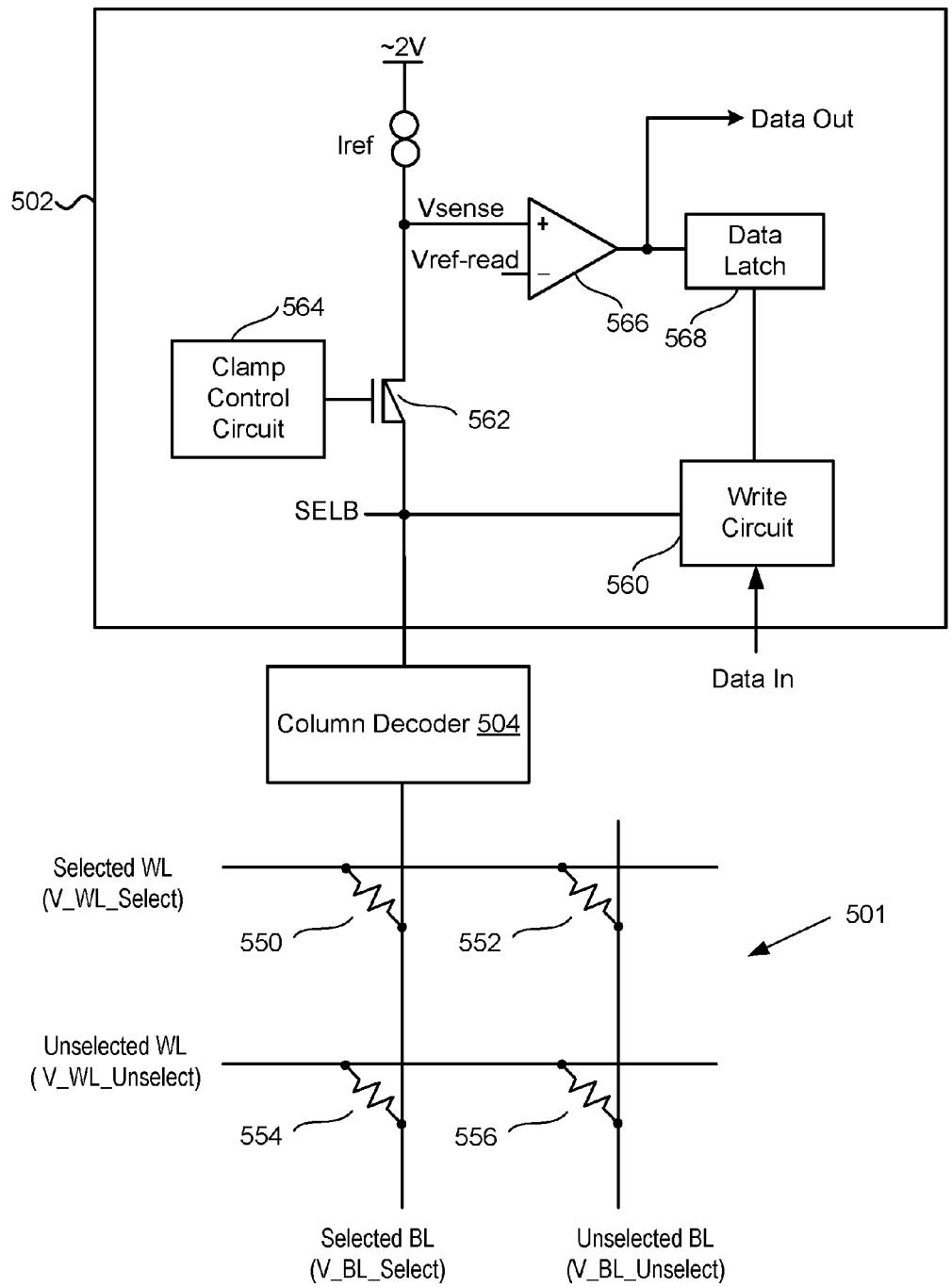
FIG. 5 depicts one embodiment of a read/write circuit along with a portion of a memory array.

FIG. 5 depicts one embodiment of a read/write circuit 502 along with a portion of a memory array 501. Read/write circuit 502 is one example of an implementation of read/write circuit 306 in FIG. 1D or read/write circuits 340, 342 in FIG. 1F. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a vertical direction that is perpendicular to the substrate, such as memory array 416 in FIG. 4.

As depicted, during a memory array operation (e.g., a programming operation), the selected word line may be biased to V_WL_Select, the unselected word line may be biased to V_WL_Unselect, the selected bit line may be biased to V_BL_Select, and the unselected bit line may be biased to V_BL_Unselect. In one embodiment, during programming, the selected word line may be biased to 0V, the unselected word line may be biased to 0.6V, the selected bit line may be biased to 1V, and the unselected bit line may be biased to 0.5V. In one embodiments, during a memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). Other voltages may be used. In other embodiments, the memory array biasing scheme may be reversed such that the selected bit line is at a lower voltage than the selected word line. For example, the selected bit line may be biased to 0V, the unselected word line may be biased to 0.4V, the selected word line may be biased to 1V, and the unselected bit line may be biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E, or 344, 345, 346, or 347 of FIG. 1F. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

In one embodiment, the magnitude of either V_WL_Select and/or V_BL_Select is used to control (e.g., limit) the programming current. In one embodiment, a memory cell has a transistor that may be used to limit the programming current. For example, a memory cell may contain a reversible resistivity element in series with a control transistor. By controlling the voltage to the control gate of the control transistor, the programming current may be controlled (e.g. limited to some target current).

Figure 6A:
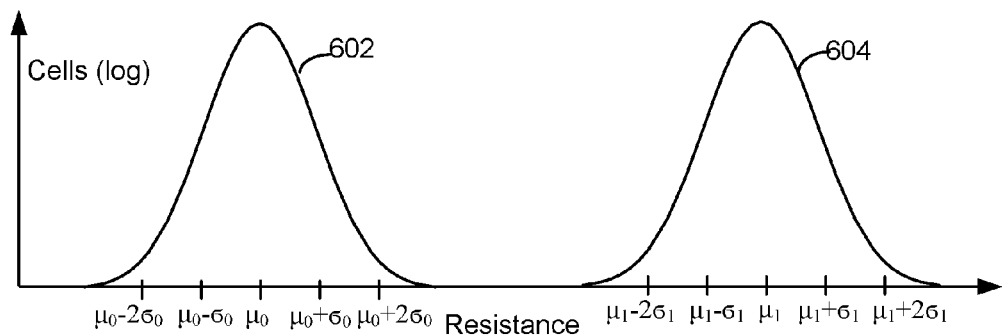
FIG. 6A depicts example resistance distributions of reversible resistivity memory cells after programming them to two states.

FIG. 6A depicts example resistance distributions of reversible resistivity memory cells after programming them to two states. The horizontal axis represents resistance of a memory cell. The vertical axis represents a count of memory cells (log). Distribution 602 is a lower resistance state, which corresponds to a "set" operation, in one embodiment. Distribution 604 is a higher resistance state, which corresponds to a "reset" operation, in one embodiment.

The example resistance distributions 602, 604 have a roughly Gaussian (or normal) distribution; however, it is not required that the resistance distributions be Gaussian. The set distribution 602 has an average resistance $\mu 0$ and a standard deviation $\sigma 0$. The reset distribution 604 has an average resistance $\mu 1$ and a standard deviation $\sigma 1$. A smaller standard deviation will lead to a tighter distribution, thereby providing more separation between the two resistance distributions 602, 604.

Figure 6B:
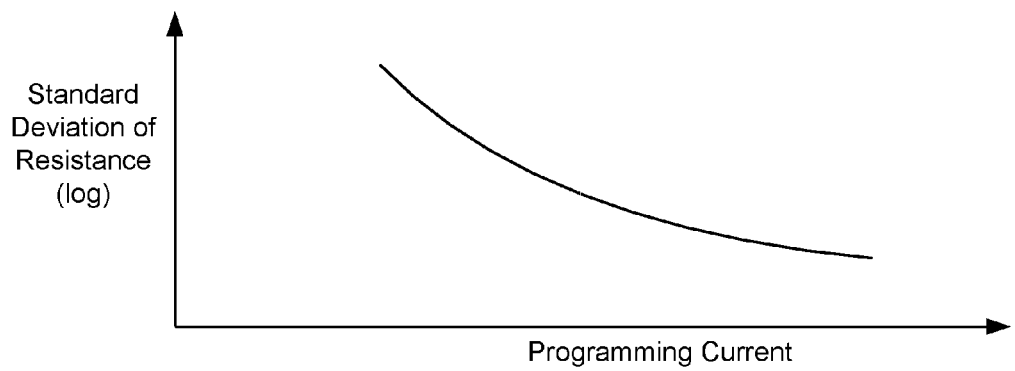
FIG. 6B depicts a curve of programming current versus standard deviation in resistance distribution for an example set of reversible resistivity memory cells.

The amount programming current used when programming some non-volatile memory cells (e.g., reversible resistivity memory cells) can impact the tightness of the resistance distributions 602, 604. Also, the state centers (e.g., $\mu 0$, $\mu 1$) may also move further apart from each other as programming current increases. For some memory cells, such as at least some reversible resistivity memory cells, there may be a relationship between programming current and standard deviation in resistance distributions. FIG. 6B depicts a curve of programming current versus standard deviation in resistance distribution for an example set of reversible resistivity memory cells. The horizontal axis represents the programming current used in a programming operation of a reversible resistivity memory cell.

The vertical axis is standard deviation in the resistance distribution. Using a greater programming current may result in a lower standard deviation. Thus, the resistance distribution may be tighter when using greater programming current. Conversely, using a lower programming current may result in a higher standard deviation. Thus, the resistance distribution may be wider when using a lower programming current.

Note that the programming current is not required to stay constant throughout the programming operation. For example, as the resistance of a reversible resistivity memory cell changes during programming, the current through the memory cell may change. For example, the voltage across the reversible resistivity memory cell could stay constant (or very close to constant), wherein the current through the memory cell may increase in response to the memory cell's resistance dropping. Alternatively, the current could decrease in response to the resistance of the memory cell increasing (again, assuming a relatively constant programming voltage). Thus, the programming current on the horizontal axis refers to a peak programming current through a reversible resistivity memory cell. However, the programming current could drop below the peak programming current for a portion of the programming operation.

Figure 6C:
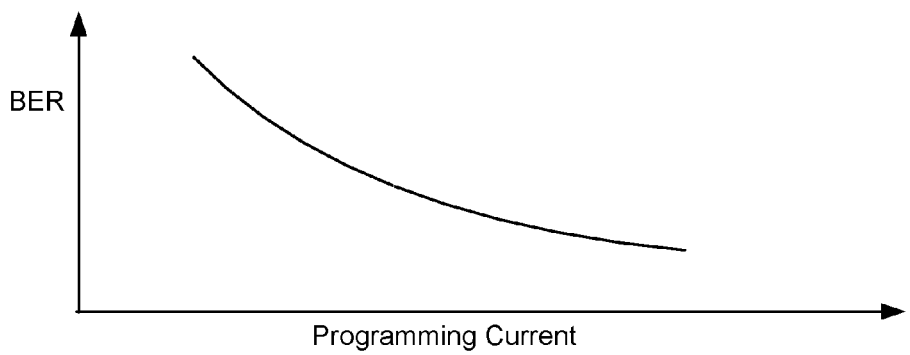
FIG. 6C depicts a curve of programming current versus BER for an example set of reversible resistivity memory cells.

The bit error rate (BER) may be impacted by the standard deviation of the resistance distributions 602, 604. For example, a higher standard deviation may lead to a wider resistance distribution, which reduces the separation between the resistance distributions 602, 604. Hence, the BER may increase when the standard deviation in the resistance distribution is greater. Also, using a lower programming current can decrease the separation between state centers (e.g., $\mu 0$, $\mu 1$). Therefore, the BER may increase when using a lower programming current. Conversely, using a higher programming current can tighten a resistance distributions, as well as increase the separation between state centers, and therefore, decrease the BER. FIG. 6C depicts a curve of programming current versus BER for an example set of reversible resistivity memory cells.

Note that this BER effect can occur due to programming either or both of the resistance distributions 602, 604. Also, the foregoing applies to examples in which more than two resistance distributions are used. For example, four resistance distributions may be used to store two bits per memory cell. In this case, when any of the four resistance distributions becomes wider, the BER may increase. Also, if the separation between any two adjacent state centers becomes closer, the BER may increase.

Other aspects of data reliability may also be impacted by the magnitude of the programming current when programming, for example, reversible resistivity memory cells. For example, data retention may be impacted by the magnitude of the programming current. Data retention refers to the ability of the memory cell to maintain its state. For reversible resistivity memory cells, data retention refers to the ability to maintain the resistance to which the memory cell was programmed. For some reversible resistivity memory cells, data retention may be better when the memory cells are programmed with a higher programming current. Conversely, data retention may be worse when the memory cells are programmed with a lower programming current. Hence, the curve of programming current to BER of FIG. 6C may be, in part, due to the impact of programming current on data retention. Other factors may also influence the impact programming current has on BER.

Figure 7A:
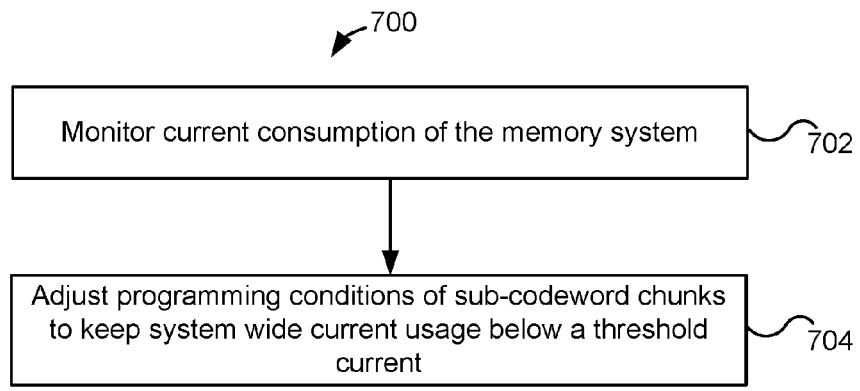
FIG. 7A is a flowchart of one embodiment of a process of adjusting programming conditions at a sub-codeword level.

FIG. 7A is a flowchart of one embodiment of a process 700 of operating a non-volatile memory system. In one embodiment, process 700 is performed by a control circuit on a non-volatile memory system. The control circuit may include, but is not limited to, memory chip controller 105, memory core control circuits 104, address decoders 170, voltage generators for selected control lines 172, voltage generators for unselected control lines 174, state machine 171, read write circuits 306, 340, 342, 502, column decoder 302, 344-347, 504, row decoder 304, 348, 350.

Step 702 includes monitoring current consumption of the non-volatile memory system. In one embodiment, step 702 includes monitoring current consumption of one or more memory die. In one embodiment, memory controller 105 receives an indication of power supply current usage from each memory die in the memory system. Step 702 may be performed more or less continuously. Note that "current usage" refers to "electrical current usage" and not "present usage". In one embodiment, each memory die periodically reports its current usage (e.g., power supply current usage) to the memory controller 105. In one embodiment, the memory controller 105 periodically polls the memory die for its current usage. The memory die might report the current usage as an analog or digital value. Note that this current usage may be based on actual present current usage and/or an estimate of current usage in the immediate future. For example, the memory dies could report estimated current usage for one or more windows of time, with a window possibly being in the immediate future. Hence, the term "monitoring current consumption" will be understood to include estimating expected current usage in the immediate future.

In step 702, the memory controller 105 may sum the current usage from each memory die to determine a total current usage for the memory system. Note that it is not required that the memory controller determine the exact amount of current that is being used by the memory system. The memory controller 105 might also add in current consumption for components other than memory die, such as the memory controller 105 itself.

In one embodiment, the memory controller 105 tracks the memory array operations that it has sent to the various memory die 102 to be executed in the immediate future, and estimates the system-wide current usage based thereon. This is another example of, "monitoring current consumption of the non-volatile memory system".

In step 704, programming conditions are adjusted when data is programmed into non-volatile memory cells in sub-codeword chunks in order to keep system wide current usage below a threshold current. This step may be performed in response to a host sending data to the memory controller 105. For example, the host may send 512 KB of data to be programmed into the memory system. The memory controller 105 might break this into pages of 32 KB each (or some other size). The memory controller 105 may determine ECC data for each page of data. The ECC data may be appended to the page to create a codeword. However, rather than programming the entire codeword in a single write operation, only a portion of the codeword is programmed single write operation, in step 704.

In one embodiment of step 704, a programming current is limited. For example, the control circuit limits the current that is allowed to flow through a memory cells that has been selected for programming ("a selected memory cell"). The process 800 of FIG. 8 describes one embodiment of step 704.

Figure 7B:
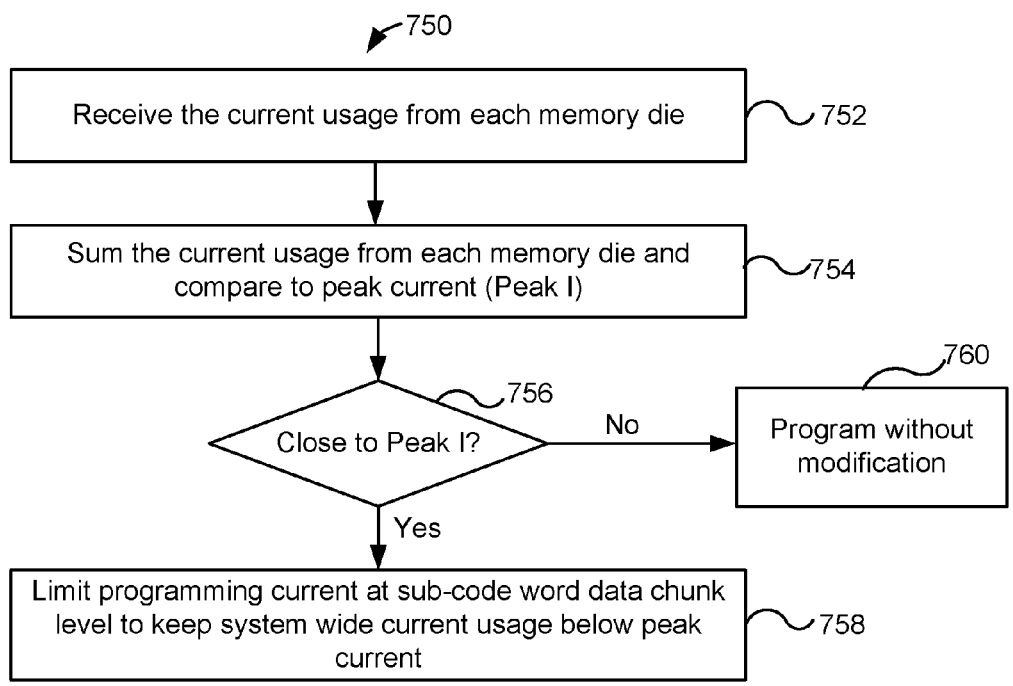
FIG. 7B is a flowchart of one embodiment of a process of limiting programming current at a sub-codeword level.

FIG. 7B is a flowchart of one embodiment of a process 750 of operating a non-volatile memory system. Process 750 proves further details for one embodiment of process 700. Steps 752-756 are one embodiment of step 702. Step 758 is one embodiment of step 704.

In step 752, the memory controller 105 receives current usage (e.g., power supply current usage) from each memory die. In step 754, the memory controller 105 sums that current usage from each memory die. In one embodiment, the memory controller 105 determines whether the sum is close to a peak allowed power supply current. For example, the memory controller 105 may compare the sum to a threshold current that is somewhat below the peak allowed power supply current. This is so that the memory controller 105 can take steps to be reasonable certain that the future power supply current usage does not exceed the peak allowed usage. Also, this may build in a buffer to factor in that there may be some current usage other than the memory dies (such as the controller 105 or other circuitry on memory system).

In step 756, the memory controller 105 determines whether the present total current usage (e.g., power supply current usage) is close to the allowed peak (e.g., power supply) current. If so, then step 758 is performed. In step 758, the control circuit adaptively changes program current of reversible resistivity memory cells at a sub-codeword level to keep power supply current below the peak allowed current level. The process 800 of FIG. 8 describes one embodiment of step 758.

By "close to the allowed peak current" in the test of step 756 it is meant that the system-wide current usage is within some threshold current of the allowed peak current. For example, if allowed peak current is 500 mA, step 756 might be used to determine whether the current usage is more than 400 mA. This allows a "buffer" to ensure that the allowed peak current is not exceeded.

If the memory controller 105 determines, in step 756, that the total system-wide current usage is not close to the allowed peak current, then programming may proceed without any special actions to keep current below the peak allowed current level (step 760). For example, data may be written in unit of entire codewords. Also, data may be written at sub-codeword chunks, but without concern for the amount of programming current.

Figure 8:
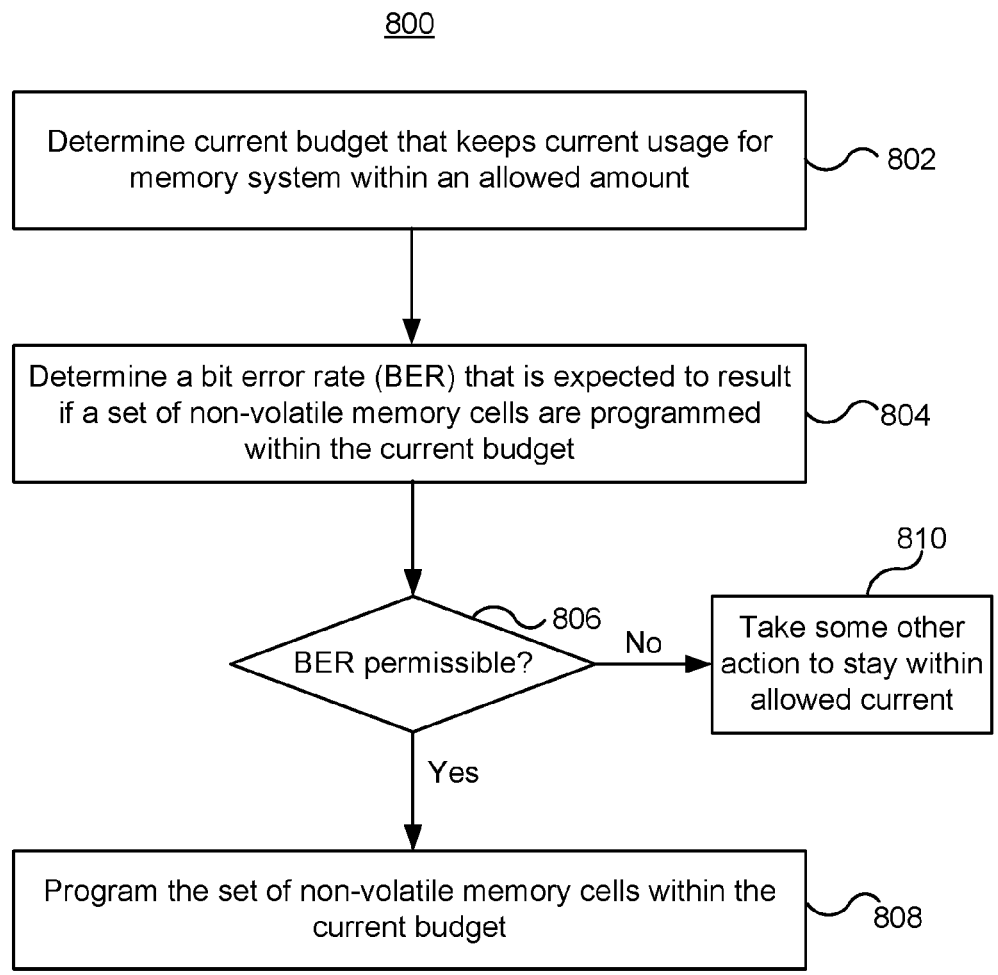
FIG. 8 is a flowchart of one embodiment of a process of predicting bit error rates of memory cells.

FIG. 8 is a flowchart of one embodiment of a process 800 of operating a non-volatile memory system. In one embodiment, process 800 is performed by a control circuit on a non-volatile memory system. Process 800 is one embodiment of step 704 from FIG. 7A.

Step 802 includes the control circuit determining a current budget that keeps current usage for the memory system within an allowed amount. The current budget refers to a maximum allowed current for programming a set of memory cells. For example, the current budget could be "x" mA. This step may include the control circuit factoring in that various memory die may undergo programming in parallel. For example, if the allowed peak current is 500 mA and the current usage is 420 mA, then the memory controller 105 may divide the 80 mA (or perhaps less to maintain a safety margin) among various memory array operations about to be performed.

Figure 10:
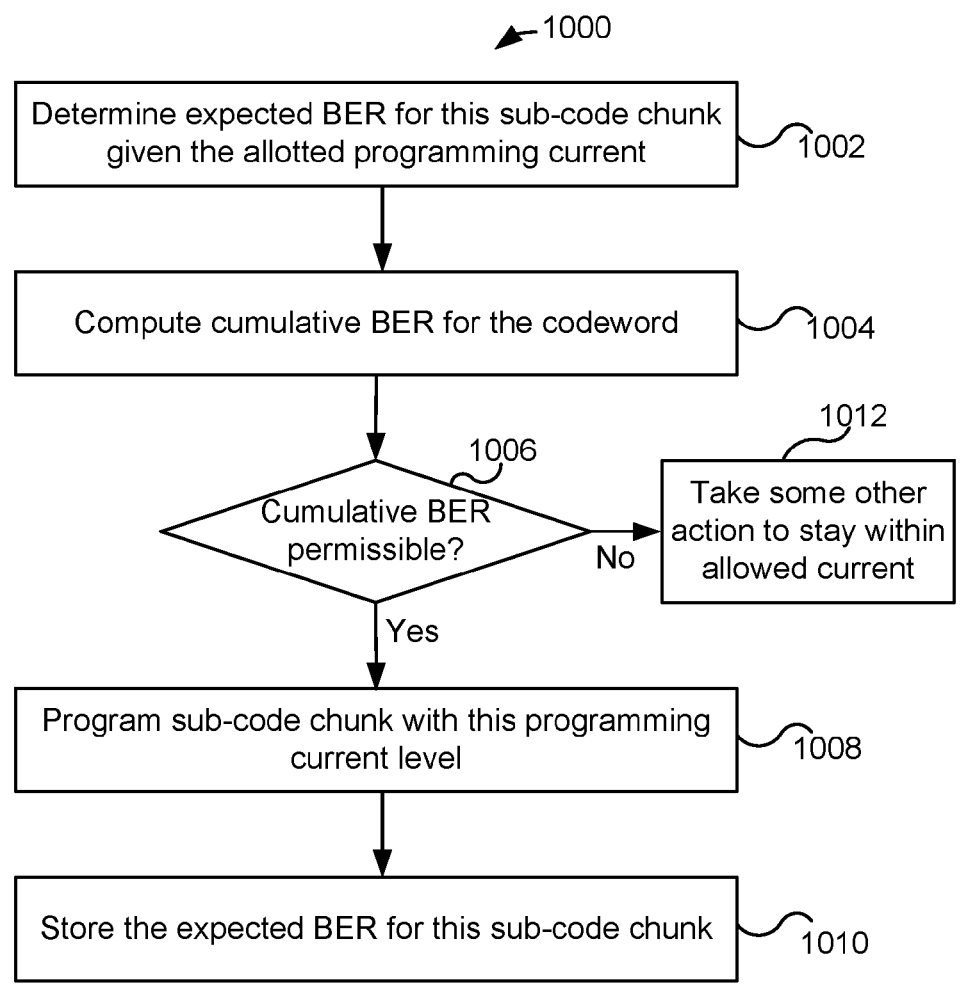
FIG. 10 is a flowchart of one embodiment of a process of programming a chunk of data at a sub-codeword level.

Step 804 includes the control circuit determining a bit error rate (BER) that is expected to result if a set of non-volatile memory cells are programmed within the current budget ("current budget" refers to "electrical current budget"). In one embodiment, first the expected BER for this set of non-volatile memory cells is determined. Stated another way, the memory controller 105 predicts the BER if this set of non-volatile memory cells is programmed within the current budget. Then, an expected BER for the entire codeword may be determined. Even if the expected BER for this set of non-volatile memory cells is relatively high, the control circuit can compensate by programming other memory cells of the codeword to have a lower expected BER. Process 1000 in FIG. 10 provides further details for one embodiment of determining expected bit error rates.

Note that the programming current is not required to stay constant throughout the programming operation. For example, as the resistance of a reversible resistivity memory cell changes during programming, the current through the memory cell may change. For example, the voltage across the reversible resistivity memory cell could stay constant (or very close to constant), wherein the current may increase in response to the memory cell's resistance dropping. Alternatively, the current could decrease in response to the resistance of the memory cell increasing (again, assuming a relatively constant programming voltage). Thus, programming "within the current budget" means that the peak programming current should not exceed the current budget. However, the programming current could drop below the current budget for a portion of the programming.

Also, note that when programming a set of memory cells, there may be some parasitic currents in addition to the current that passes through the set of memory cells being programmed. For example, referring to FIG. 5, memory cell 550 may be "selected," memory cell 556 may be "unselected," and memory cell 552 and 554 may be "partially-selected." Memory cells 552 and 554 are not selected for programming, but may each have some non-zero voltage across them. Thus, it is possible for some parasitic current to result. It is also possible for a small amount of parasitic current to be drawn as a result of the voltage across memory cell 556. The memory controller 105 factors in these, and possibly other, parasitic currents in one embodiment of step 804. In other words, the memory controller 105 may divide the current budget between selected memory cells and expected parasitic currents. As one example, the memory controller 105 determines a total amount of current that will be consumed by a bay by both selected memory cells and unselected memory cells. The memory controller 105 may then determine how much programming current may be allotted to a single selected memory cell.

Step 804 may also include the control circuit factoring in a condition of the set of memory cells to be programmed. For example, as memory cells age the expected BER may increase. As one example, the expected BER may depend on the number of times the memory cells have been programmed. Thus, in one embodiment, the control circuit 105 track the number of times a unit of memory cells has been programmed. This tracking could be done on a block level, word line level, or some other level.

Figure 9:
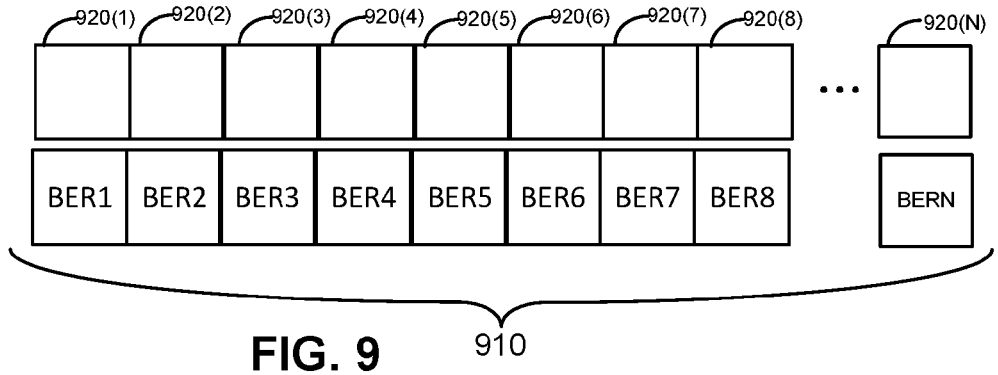
FIG. 9 is a diagram that represents a codeword divided into "N" sub-codewords.

Step 806 includes a test of whether a BER is permissible for this set of memory cells. As noted above, a separate BER may be determined for both this sub-codeword chunk and the entire codeword. In one embodiment, the memory controller 105 determines whether a decoder within the memory controller 105 will be able to successfully decode the codeword, given the predicted BER for the entire codeword. In one embodiment, the memory controller 105 keeps track of expected BERs for sub-codeword chunks within a codeword. The expected BERs for the sub-codewords may be used, along with the predicted BER for this sub-codeword, to determine whether the predicted BER for this codeword is permissible. FIGS. 9 and 10 provide further details of determining whether the BER is permissible. If the BER is permissible, then step 808 is performed.

In one embodiment, the memory controller 105 determines whether the BER for this sub-codeword is permissible, in step 806. For example, there may be a limit as to how high the BER can be for any one sub-codeword chunk regardless of the BER of other sub-codeword chunks.

Step 808 includes the control circuit programming the set of non-volatile memory cells within the current budget. Various techniques may be used to program the set of non-volatile memory cells within the current budget. In one embodiment, one or more voltages that are applied during programming are selected to program the set of non-volatile memory cells within the current budget. For example, referring to FIG. 5, the selected word line voltage (e.g., V_WL_Select) and/or the selected bit line voltage (V_BL_Select) may be selected to stay within the current budget. Step 808 may also include changing the unselect voltages (e.g., V_WL_Unselect, V_BL_Unselect) to stay within the current budget.

In one embodiment, the current that is allowed to flow through a selected memory cell is limited during programming. Thus, limiting the current that is allowed to flow through a selected memory cell during programming is one embodiment to stay within the current budget. In one embodiment, the memory cell includes a current limiting device (e.g., a transistor) in series with the memory cell. By controlling the control gate voltage of the current limiting transistor, the current that is permitted to flow through the memory cell may be limited to some target level. A current limiting transistor can be located elsewhere than in the memory cell. For example, with reference to FIG. 4, a current limiting transistor may be placed in series with the bit line vertical bit line connected to the non-volatile storage element. One possibility is for select devices (e.g., $Q_{11}$-$Q_{31}$) to limit the current in the selected bit line.

If the memory controller determines, in step 806, that the BER is not permissible, then step 810 is performed. In step 810 another action is taken to stay within the allowed current. One possibility is to defer the programming of this unit of data.

In one embodiment, the memory controller 105 keeps track of expected BERs for sub-codeword chunks of data. This data is maintained at least until the entire codeword is programmed, in one embodiment. FIG. 9 is a diagram that represents a codeword 910 divided into "N" sub-codewords 920(1)-920(N). The sub-codewords are not required to be the same size. Each sub-codeword 920 can be programmed separately into a set of non-volatile memory cells. For example, a sub-codeword 920 may be some integer number of bytes. The memory controller 105 stores an expected bit error rate (BER) for the program conditions (e.g., current) used to program each of the chunks. Table I provides two example cases for two different codewords. BER1 to BERN refer to the respective bit error rates for sub-codeword chunks 920(1) to 920(n). For the sake of discussion, it will be assumed that the sub-codewords are programmed in left to right, but this is not required.

TABLE I

|  | BER1 | BER2 | BER3 | BER4 | BER5 | BER6 | BER7 | BER8 | BERN |
|---|---|---|---|---|---|---|---|---|---|
| Case 1 | Low | Low | High | Med | Med | Low | Low | High | — |
| Case 2 | High | Med | High | Med | High | Med | Low | Low | — |

FIG. 10 is a flowchart of one embodiment of a process 1000 of programming a chunk of data at a sub-codeword 920 level. The process 1000 may be repeated for other sub-codeword chunks 920.

Step 1002 includes the memory controller 105 determining an expected BER for the present chunk of data to be programmed. This chunk of data corresponds to one sub-codeword 920. Step 1002 may be based on an allotted programming current per selected memory cell. For example, if 32 memory cells are selected for programming this chunk, the memory controller 105 may calculate the allotted programming current for each selected memory cell, factoring in parasitic currents and controller IO overhead.

In one embodiment, the memory controller 105 accesses a table that contains an association between programming current per memory cell and BER. Such a table can be developed by performing engineering qualification on a memory system, or by measuring actual BER during read operations. As noted in the discussion of FIGS. 6A-6C, for some types of memory cells, there may be a relationship between programming current per memory cell and BER.

Step 1004 includes the memory controller 105 determining a cumulative expected BER that characterizes the codeword 910. For example, referring to FIG. 9, the memory controller 105 determines a BER based on each of the BERs that have been stored so far. As a particular example, the memory controller 105 might have previously programmed sub-codeword chunks 920(1) through 920(7), with sub-codeword chunk 920(8) being the present sub-codeword chunk. The memory controller 105 may total the expected BERs for sub-codeword chunks 920(1) through 920(8). This may be done by weighting the expected BER for each sub-codeword chunk by the size of the sub-codeword chunk.

For case 1 in Table 1, the cumulative BER for the codeword may be relatively low when sub-codeword 920(8) is about to be programmed due to the fact that there is a low BER for four sub-codewords, and only one high BER. For case 2 in Table 1, the cumulative BER for the codeword may be relatively high due to the fact that there is a high BER for three sub-codewords, and only one low BER.

Note that in most cases, some of the sub-codeword chunks will have not yet been programmed. Moreover, the allotted current for these sub-codeword chunks may not have been determined yet. Thus, the memory controller 105 might not have determined an expected BER for some chunks, based on allotted current. However, the memory controller 105 may still estimate an expected BER to these chunks with an assumption of an allotted current. In some cases, the memory controller 105 will assume that a relatively high programming current will be allotted, such that a lower BER can be assumed. The memory controller 105 might elect to have such chunks programmed at a time when total memory system current usage is relatively low.

However, note that it is not required for the memory controller 105 to make an estimate of the BER for the entire codeword. In one embodiment, the memory controller 105 simply estimates the cumulative BER from the BERs of the sub-codewords for which a prediction of BER has been made so far, based on programming current for those sub-codewords. In other words, it is not required that the memory controller 105 factor all sub-codewords 920(1) to 920(N) in the cumulative BER.

Step 1006 includes the memory controller 105 determining whether the cumulative BER for the present codeword is permissible. This may be based on the cumulative expected BER, how many additional chunks of the codeword are to be programmed, and a permissible BER for the entire codeword 910. Assuming that the expected cumulative BER for the codeword is allowable, then step 1008 may be performed. For example, referring to case 1 in Table 1, a relatively high BER may be permitted for sub-codeword 920(8), due to the fact that the cumulative BER is still within a decodable level. Note that the cumulative BER could be allowed to go somewhat over a decodable level with the assumption that later chunks will be programmed with a higher current (and corresponding lower BER).

As noted, the permitted BER for the present sub-codeword chunk may be greater or less than the permitted BER for the entire codeword. For example, if this were one of the first sub-codeword chunks to be programmed, a relatively high expected BER could be permitted with the expectation of forcing a lower expected BER for sub-codeword chunks to be programmed later. In this example, the total BER for the codeword can be kept within a permissible amount in order to successfully decode the codeword. Referring to Table 1, case 2 presents such an example. For example, the memory controller 105 may restrict BER8 to be relatively low in order to keep the cumulative BER within a decodable level.

Also, note that in some cases, the BER of the present sub-codeword chunk itself may be so high as to not be permitted, even if the cumulative BER of the codeword is low enough to be permitted. Hence, step 1006 may also consider the BER of the present sub-codeword chunk by itself.

In step 1008, the sub-codeword chunk 920 is programmed within the allotted programming current level. Various techniques may be used to limit the programming current. In one embodiment, one or more voltages that are applied during programming are selected to limit the programming current level. For example, referring to FIG. 5, the selected word line voltage (e.g., V_WL_Select) and/or the selected bit line voltage (V_BL_Select) may be selected to control the programming current.

In one embodiment, the current that is allowed to flow through a selected memory cell is limited during programming. In one embodiment, the memory cell includes a current limiting device (e.g., a transistor) in series with the memory cell. By controlling the control gate voltage of the current limiting transistor, the current that is permitted to flow through the memory cell may be limited to some target level. A current limiting transistor can be located elsewhere than in the memory cell. For example, with reference to FIG. 4, a current limiting transistor may be placed in series with the bit line vertical bit line connected to the non-volatile storage element. One possibility is for select devices (e.g., $Q_{11}$-$Q_{31}$) to limit the current in the selected bit line.

In step 1010, the memory controller 105 stores the expected BER for this sub-codeword chunk 920. The memory controller 105 keeps this at least until the entire codeword 910 has been processed.

Figure 11:
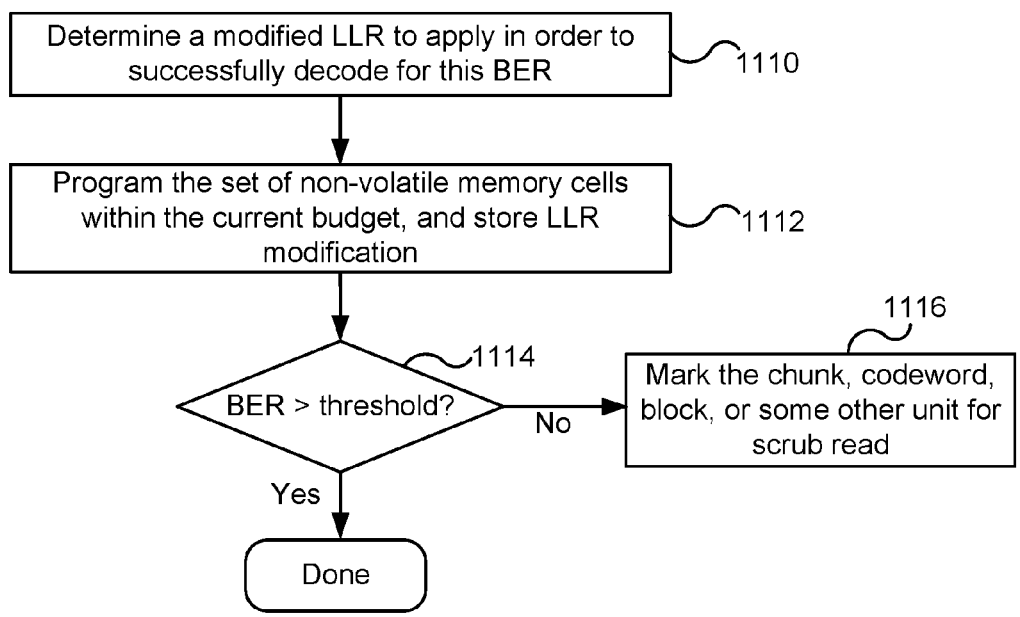
FIG. 11 is a flowchart of one embodiment of a process of storing information to help read memory cells for which current may have been limited during programming.

If the memory controller 105 determined that the cumulative expected BER is too high in step 1006, then step 1012 may be performed. Step 1012 is to take some other step to stay within the allotted program current. In one embodiment, the present sub-codeword chunk 920 is programmed using a higher programming current than the allotted programming current. However, this may require delaying the programming of this sub-codeword chunk or delaying some other memory array operation. Another possibility is to take additional steps are taken to ensure reliability when reading back memory cells for which current may have been limited during programming. FIG. 11 describes one such embodiment.

FIG. 11 is a flowchart of one embodiment of a step 1012. In this embodiment, the memory controller 105 stores information to help read reversible resistivity memory cells for which current may have been limited during programming. In one embodiment, the memory controller 105 stores an indication of a modified log likelihood ratio (LLR) that may be used when decoding data read from non-volatile memory cells. The modified LLR may be able to correct a greater number of errors in the codeword than an LLR that is normally used, and/or may improve error correction latency. Hence, the modified LLR may permit a higher expected BER for the codeword.

Step 1110 includes determining a modified LLR to apply when decoding the codeword. This modified LLR is one that should be able to successfully decode the codeword, given the expected cumulative BER from step 1004.

In step 1112, the sub-codeword chunk 920 is programmed using the allotted current (from step 1002) to keep the total memory system current usage within the target. Also, the modified LLR is stored, such that it may be used when reading back and decoding the codeword. One embodiment includes later reading back the codeword, and using the stored LLR to successfully decode the codeword.

Step 1114 is a comparison of an expected BER with a threshold. In one embodiment, step 1114 includes comparing the predicted BER for the present sub-codeword chunk 920 to a threshold. In one embodiment, step 1114 includes comparing the predicted BER for the cumulative BER for the codeword to a threshold. Both of these tests could be performed.

The threshold(s) in step 1114 may be a higher BER than the one in step 1106, in one embodiment. If the expected BER is greater than the threshold(s) of step 1114, then at least this sub-codeword chunk is marked for a scrub read. A larger unit such as the entire codeword, a block in which the sub-codeword chunk resides, etc. may be marked for scrub read.

A scrub read is an operation that reads back the data and programs it again. The scrub read may program the data in the same memory cells from which it is read. However, another option is to move the data to other memory cells. The scrub read is typically performed at a time when system utilization is low.

One embodiment disclosed herein includes a non-volatile memory system, comprising a plurality of non-volatile memory cells and a control circuit in communication with the plurality of non-volatile memory cells. The control circuit is configured to monitor current consumption of the non-volatile memory system, program data into the plurality of non-volatile memory cells in sub-codeword chunks, and adjust programming conditions of the sub-codeword chunks to keep the current consumption of the non-volatile memory system below a threshold current.

In a further embodiment to the previous paragraph, one embodiment of the control circuit is further configured to limit a programming current to program a sub-codeword chunk into a set of the non-volatile memory cells to keep the current consumption of the non-volatile memory system within the threshold current.

In a further embodiment to either of the two previous paragraphs, the plurality of non-volatile memory cells are reversible resistivity memory cells.

In a further embodiment to any of the three previous paragraphs, wherein, to adjust programming conditions of the sub-codeword chunks, the control circuit is configured to: determine a bit error rate (BER) that is expected to result if a set of the non-volatile memory cells that are to store a first sub-codeword of a selected codeword are programmed within a current budget; determine a cumulative BER for the selected codeword based on the expected BER for the first sub-codeword and expected BERs for other sub-codewords of the selected codeword; and program the set of non-volatile memory cells within the current budget responsive to a determination that the cumulative BER is less than a threshold BER.

In a further embodiment to any of the four previous paragraphs, the expected BER is a first expected bit error rate. The control circuit is further configured to program a second sub-codeword of the selected codeword into non-volatile memory cells using a current that corresponds to a second expected BER that is lower than the first expected BER to stay within the threshold BER for the selected codeword.

In a further embodiment to any of the five previous paragraphs, the control circuit is further configured to: determine a log-likelihood ratio that will allow the selected codeword to be successfully decoded given the cumulative BER; store the log-likelihood ratio; and use the log-likelihood ratio to successfully decode the selected codeword.

In a further embodiment to any of the six previous paragraphs, the control circuit is further configured to mark the selected codeword as a candidate for a scrub operation responsive to a determination that the cumulative BER is less than the first threshold BER but more than a second threshold BER.

In a further embodiment to any of the seven previous paragraphs, the control circuit is further configured to mark the set of non-volatile memory cells as a candidate for a scrub operation responsive to a determination that the expected BER for the set of non-volatile memory cells more than an allowed threshold for the set of non-volatile memory cells.

In a further embodiment to any of the eight previous paragraphs, the memory system further comprises a plurality of memory dies, each die comprising a portion of the plurality of non-volatile memory cells. The control circuit is further configured to monitor power supply current consumption of the plurality of memory dies; and adjust the programming conditions of the chunks of sub-codewords to keep the current consumption of the plurality of memory dies within an allowed peak power supply current responsive to a determination that the power supply current consumption of the plurality of memory dies is within a certain amount of the allowed peak power supply current.

In a further embodiment to any of the nine previous paragraphs the plurality of non-volatile memory cells reside in a three-dimensional memory array.

One embodiment disclosed herein includes a method of operating a non-volatile memory system. The method comprises receiving a power supply current usage from each of plurality of memory dies in the non-volatile memory system, each of the memory dies comprising reversible resistivity non-volatile memory cells; comparing a total power supply current by all of the plurality of memory dies to a threshold; and limiting programming current when programming data into the reversible resistivity non-volatile memory cells in chunks of sub-codewords to keep the total power supply current within the threshold.

One embodiment disclosed herein includes a non-volatile memory system, comprising a plurality of memory dies, each memory die comprising a plurality of non-volatile reversible resistivity memory cells. The non-volatile memory system also has means for determining a power supply current usage for each of plurality of memory dies in the non-volatile memory system; means for determining whether a total power supply current usage by all of the plurality of memory dies exceeds a threshold; means for determining a bit error rate that is expected to result if a set of non-volatile memory cells in a first of the memory die are programmed to store a sub-codeword of a selected codeword within a current budget that keeps the total power supply current usage from exceeding the threshold; means for cumulating expected bit error rates of sub-codewords of the selected codeword to determine a cumulative expected bit error rate of the selected codeword; means for determining whether the cumulative expected bit error rate of the selected codeword is less than a maximum allowed bit error rate; and means for programming the set of non-volatile memory cells in the first memory die within the current budget responsive to a determination that the cumulative expected bit error rate is less than a maximum allowed bit error rate.

Means for determining a power supply current usage for each of plurality of memory dies in the non-volatile memory system may include, but are not limited to, memory chip controller 105, processor 105*c*, code stored within RAM 105*b* and executed on processor 105*c*, code stored within ROM 105*a* and executed on processor 105*c*, code stored within memory core 103 and executed on processor 105*c*, memory core control circuits 104, and/or other hardware or software that executes on a processor.

Means for determining a bit error rate that is expected to result if a set of non-volatile memory cells in a first of the memory die are programmed to store a sub-codeword of a selected codeword within a current budget that keeps the total power supply current usage from exceeding the threshold may include, but are not limited to, memory chip controller 105, processor 105*c*, code stored within RAM 105*b* and executed on processor 105*c*, code stored within ROM 105*a* and executed on processor 105*c*, code stored within memory core 103 and executed on processor 105*c*, and/or other hardware or software that executes on a processor.

Means for cumulating expected bit error rates of sub-codewords of the selected codeword to determine a cumulative expected bit error rate of the selected codeword may include, but are not limited to, memory chip controller 105, processor 105*c*, code stored within RAM 105*b* and executed on processor 105*c*, code stored within ROM 105*a* and executed on processor 105*c*, code stored within memory core 103 and executed on processor 105*c*, and/or other hardware or software that executes on a processor.

Means for determining whether the cumulative expected bit error rate of the selected codeword is less than a maximum allowed bit error rate may include, but are not limited to, memory chip controller 105, processor 105*c*, code stored within RAM 105*b* and executed on processor 105*c*, code stored within ROM 105*a* and executed on processor 105*c*, code stored within memory core 103 and executed on processor 105*c*, and/or other hardware or software that executes on a processor.

Means for programming the set of non-volatile memory cells in the first memory die within the current budget responsive to a determination that the cumulative expected bit error rate is less than a maximum allowed bit error rate may include, but are not limited to, memory chip controller 105, processor 105*c*, code stored within RAM 105*b* and executed on processor 105*c*, code stored within ROM 105*a* and executed on processor 105*c*, code stored within memory core 103 and executed on processor 105*c*, memory core control circuits 104, address decoders 170, state machine 171, voltage generators for selected control lines 172, voltage generators for unselected control lines, select transistors Q11-Q33, and/or other hardware or software that executes on a processor.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-volatile memory system, comprising:
   a plurality of non-volatile memory cells;
   a control circuit in communication with the plurality of non-volatile memory cells, the control circuit configured to:
   monitor current consumption of the non-volatile memory system;
   program data into the plurality of non-volatile memory cells in sub-codeword chunks; and
   adjust programming conditions of the sub-codeword chunks in a selected codeword to keep the current consumption of the non-volatile memory system below a threshold current and an expected bit error rate (BER) of the selected codeword within a threshold BER, including the control circuit configured to limit a programming current used to program a first sub-codeword chunk into a set of the non-volatile memory cells to a current level expected to result in a BER for the first sub-codeword chunk that is greater than the threshold BER.

2. The non-volatile memory system of claim 1, wherein the plurality of non-volatile memory cells are reversible resistivity memory cells.

3. The non-volatile memory system of claim 1 wherein, to adjust programming conditions of the sub-codeword chunks, the control circuit is configured to:
   determine the BER that is expected to result if the set of non-volatile memory cells that are to store the first sub-codeword are programmed within a current budget;
   determine a cumulative BER for the selected codeword based on the expected BER for the first sub-codeword chunk and expected BERs for other sub-codeword chunks of the selected codeword; and
   program the set of non-volatile memory cells within the current budget responsive to a determination that the cumulative BER is less than the threshold BER.

4. The non-volatile memory system of claim 3, wherein the expected BER for the first sub-codeword chunk is a first expected bit error rate, wherein the control circuit is further configured to:
   program a second sub-codeword chunk of the selected codeword into non-volatile memory cells using a current that corresponds to a second expected BER that is lower than the first expected BER to stay within the threshold BER for the selected codeword.

5. The non-volatile memory system of claim 3, wherein the control circuit is further configured to:
   determine a log-likelihood ratio that will allow the selected codeword to be successfully decoded given the cumulative BER;
   store the log-likelihood ratio; and
   use the log-likelihood ratio to successfully decode the selected codeword.

6. The non-volatile memory system of claim 5, wherein the threshold BER is a first threshold BER, wherein control circuit is further configured to:
   mark the selected codeword as a candidate for a scrub operation responsive to a determination that the cumulative BER is less than the first threshold BER but more than a second threshold BER.

7. The non-volatile memory system of claim 3, wherein the control circuit is further configured to:
   mark the set of non-volatile memory cells as a candidate for a scrub operation responsive to a determination that the expected BER for the set of non-volatile memory cells is more than an allowed threshold for the set of non-volatile memory cells.

8. The non-volatile memory system of claim 1, further comprising:
   a plurality of memory dies, each die comprising a portion of the plurality of non-volatile memory cells, wherein the control circuit is further configured to:
   monitor power supply current consumption of the plurality of memory dies; and
   adjust the programming conditions of the sub-codeword chunks to keep the current consumption of the plurality of memory dies within an allowed peak power supply current responsive to a determination that the power supply current consumption of the plurality of memory dies is within a certain amount of the allowed peak power supply current.

9. The non-volatile memory system of claim 1, wherein the plurality of non-volatile memory cells reside in a three-dimensional memory array.

10. A method of operating a non-volatile memory system, comprising:
    accessing a total power supply current usage of a plurality of memory dies in the non-volatile memory system, each of the memory dies comprising reversible resistivity non-volatile memory cells;
    programming data into reversible resistivity non-volatile memory cells in sub-codeword chunks;
    adjusting programming conditions of the sub-codeword chunks in a selected codeword to keep the total power supply current usage below a threshold current and an expected bit error rate (BER) of the selected codeword within a decodable BER; and
    limiting programming current when programming data into the reversible resistivity non-volatile memory cells in a first sub-codeword chunk of the selected codeword to keep the total power supply current within the threshold current despite the first sub-codeword chunk having an expected BER that is greater than the decodable BER for the selected codeword.

11. The method of claim 10, wherein the adjusting programming conditions comprises:
    predicting a bit error rate (BER) for programming the first sub-codeword chunk using a current budget that keeps the total power supply current from exceeding the threshold current;
    predicting a cumulative BER for the selected codeword based on the predicted BER for the non-volatile memory cells that are to store the first sub-codeword chunk and predicted BERs for programming other sub-codeword chunks of the selected codeword; and
    programming the non-volatile memory cells that are to store the first sub-codeword chunk within the current budget responsive to a determination that the predicted cumulative BER for the selected codeword is less than a BER that can be successfully decoded by a decoder in the memory system.

12. The method of claim 11, further comprising:
determining a log-likelihood ratio that will allow the selected codeword to be successfully decoded by the decoder given the predicted cumulative BER for the selected codeword;
storing the log-likelihood ratio;
reading the selected codeword from reversible resistivity non-volatile memory cells; and
using the log-likelihood ratio to successfully decode the selected codeword.

13. The method of claim 11, further comprising:
marking non-volatile memory cells that store the selected codeword as a candidate for a scrub operation responsive to a determination that the predicted cumulative BER of the selected codeword is less than a BER that can be successfully decoded by the decoder but more than a second BER that is less than the BER that can be successfully decoded by the decoder.

14. The method of claim 11, wherein the predicting a bit error rate (BER) for programming the first sub-codeword chunk comprises:
factoring in a condition of the non-volatile memory cells that are to store the first sub-codeword chunk.

15. The method of claim 10, wherein the limiting programming current comprises:
limiting a maximum programming current by applying a control voltage to a transistor.

16. The method of claim 10, wherein the limiting programming current comprises:
limiting a programming current by applying a first select voltage to a selected word line and a second select voltage to a selected bit line.

17. A non-volatile memory system, comprising:
a plurality of memory dies, each memory die comprising a plurality of non-volatile reversible resistivity memory cells;
means for determining a power supply current usage for each of plurality of memory dies in the non-volatile memory system;
means for determining whether a total power supply current usage by all of the plurality of memory dies exceeds a threshold;
means for programming data into sets of the non-volatile reversible resistivity memory cells in sub-codeword chunks;
means for adjusting programming conditions of the sub-codeword chunks in a selected codeword to keep the total power supply current below a threshold current and an expected bit error rate (BER) of the selected codeword within a decodable BER;
means for limiting a current used to program a first sub-codeword chunk of the selected codeword in a set of the reversible resistivity memory cells within a current budget that keeps the total power supply current usage from exceeding the threshold current;
means for determining a BER that is expected to result if the set of reversible resistivity memory cells are programmed within the current budget;
means for cumulating expected bit error rates of sub-codewords of the selected codeword to determine a cumulative expected BER of the selected codeword;
means for determining whether the cumulative expected BER of the selected codeword is within a decodable BER; and
means for programming the set of non-volatile memory cells within the current budget responsive to a determination that the cumulative expected BER is within the decodable BER despite an expected BER for the first sub-codeword chunk being greater than the decodable BER.

18. The non-volatile memory system of claim 17, wherein the means for programming the set of non-volatile memory cells comprises means for limiting a maximum programming current.

19. The non-volatile memory system of claim 17, further comprising:
means for determining a log-likelihood ratio that will allow the selected codeword to be successfully decoded given the cumulative expected bit error rate for the selected codeword;
means for storing the log-likelihood ratio;
means for reading the selected codeword from reversible resistivity non-volatile memory cells; and
means for using the log-likelihood ratio to successfully decode the selected codeword.

* * * * *